United States Patent
Leuten et al.

(10) Patent No.: US 10,872,880 B2
(45) Date of Patent: Dec. 22, 2020

(54) LAND GRID ARRAY PACKAGE EXTENSION (71) Applicant: Intel Corporation, Santa Clara, CA (US)

(72) Inventors: Tyler Leuten, Orangevale, CA (US); Min-Tih Lai, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/387,432

(22) Filed: Apr. 17, 2019

(65) Prior Publication Data

US 2019/0244931 A1 Aug. 8, 2019

Related U.S. Application Data (62) Division of application No. 15/392,832, filed on Dec. 28, 2016, now Pat. No. 10,304,799.

(51) Int. Cl.
H01L 25/065 (2006.01)
H01L 25/00 (2006.01)
H01L 23/498 (2006.01)
H01L 23/00 (2006.01)
H01L 25/10 (2006.01)
(Continued)

(52) U.S. Cl.
CPC .......... *H01L 25/0652* (2013.01); *H01L 23/13* (2013.01); *H01L 23/49816* (2013.01); *H01L 23/49838* (2013.01); *H01L 24/17* (2013.01); *H01L 25/105* (2013.01); *H01L 25/50* (2013.01); *H01L 23/50* (2013.01); *H01L 24/16* (2013.01); *H01L 2224/16145* (2013.01); *H01L 2224/16227* (2013.01); *H01L 2224/171* (2013.01); *H01L 2224/1703* (2013.01); *H01L 2224/17181* (2013.01); *H01L 2224/2919* (2013.01);
(Continued)

(58) Field of Classification Search
None
See application file for complete search history.

(56) References Cited

U.S. PATENT DOCUMENTS 5,244,143 A 9/1993 Ference et al.
6,443,351 B1 9/2002 Huang et al.
(Continued)

OTHER PUBLICATIONS

Final Office Action for U.S. Appl. No. 15/392,832, dated Sep. 7, 2018.
(Continued)

*Primary Examiner* — Telly D Green
(74) *Attorney, Agent, or Firm* — Green, Howard & Mughal LLP.

(57) ABSTRACT

BGA packages with a LGA package extension. First lands on a substrate are populated with solder balls, while only solder paste is dispensed on second lands that are surrounded by the first lands. Differences in solder stand-off may accommodate non-planarity in a package or the insertion of an LGA extension component, such as an IC or one or more discrete devices. Where an LGA extension component is attached to the second lands, solder paste may be further dispensed on third lands located on a package-side of the extension component. A BGA package is then attached to the first lands and third lands. The larger volume BGA solder connections maintaining mechanical reliability, particularly where the solder ball interconnects form a perimeter surrounding the low-volume solder interconnects.

14 Claims, 8 Drawing Sheets (51) Int. Cl.
  *H01L 23/13* (2006.01)
  *H01L 23/50* (2006.01)
(52) U.S. Cl.
  CPC .............. *H01L 2224/32145* (2013.01); *H01L 2224/73253* (2013.01)

(56) References Cited

U.S. PATENT DOCUMENTS

| | | |
|---|---|---|
| 6,689,412 B1 | 2/2004 | Bourrieres |
| 6,736,308 B1 | 5/2004 | Downes |
| 7,190,060 B1 * | 3/2007 | Chiang ............. H01L 23/49555 257/673 |
| 8,268,672 B2 | 9/2012 | Van Veen et al. |
| 8,471,154 B1 | 6/2013 | Yoshida et al. |
| 9,691,724 B2 | 6/2017 | Iihola et al. |
| 9,842,818 B2 | 12/2017 | Li et al. |
| 2004/0184248 A1 | 9/2004 | Alger et al. |
| 2004/0262774 A1 | 12/2004 | Kang et al. |
| 2007/0075431 A1 | 4/2007 | Miyazaki et al. |
| 2007/0102481 A1 | 5/2007 | Kato et al. |
| 2007/0222059 A1 | 9/2007 | Roberts et al. |
| 2010/0001045 A1 | 1/2010 | Cordes et al. |
| 2011/0169562 A1 | 7/2011 | Li et al. |
| 2011/0186998 A1 | 8/2011 | Wu et al. |
| 2011/0275176 A1 | 11/2011 | Van Veen et al. |
| 2012/0091580 A1 | 4/2012 | Jeong et al. |
| 2013/0087910 A1 | 4/2013 | Razak |
| 2013/0168871 A1 | 7/2013 | Kim et al. |
| 2014/0001639 A1 | 1/2014 | Hiraishi et al. |
| 2014/0021607 A1 | 1/2014 | Arvin et al. |
| 2014/0091463 A1 | 4/2014 | Yu et al. |
| 2015/0108204 A1 | 4/2015 | Zheng et al. |
| 2015/0145129 A1 * | 5/2015 | Chen ...................... H01L 24/81 257/737 |
| 2015/0206832 A1 | 7/2015 | Kudo |
| 2015/0241476 A1 | 8/2015 | Dang et al. |
| 2016/0307832 A1 | 10/2016 | Uzoh et al. |
| 2017/0012081 A1 * | 1/2017 | Shen ...................... H01L 24/81 |
| 2017/0278816 A1 * | 9/2017 | Li ........................... H01L 24/11 |
| 2017/0290158 A1 | 10/2017 | Pihlman et al. |
| 2018/0068969 A1 | 3/2018 | Li et al. |

OTHER PUBLICATIONS

International Search Report and Written Opinion for International Patent Application No. PCT/US17/63524, dated Mar. 30, 2018.
Notice of Allowance for U.S. Appl. No. 15/392,832, dated Feb. 1, 2019.
Office Action for U.S. Appl. No. 15/392,832, dated Mar. 26, 2018.
Restriction Requirement for U.S. Appl. No. 15/392,832, dated Oct. 4, 2017.
International Preliminary Report on Patentability for International Patent Application No. PCT/US2017/063524, dated Jul. 11, 2019, 11 pgs.

* cited by examiner

LAND GRID ARRAY PACKAGE EXTENSION

CLAIM FOR PRIORITY

This Application is a Divisional of, and claims priority to, U.S. application Ser. No. 15/392,832, filed on Dec. 28, 2016 and titled "LAND GRID ARRAY PACKAGE EXTENSION", which is incorporated by reference in its entirety for all purposes.

BACKGROUND

A ball grid array (BGA) package is a type of packaging for integrated circuits (ICs). BGA packages permanently mount to a board or other package with balls of solder that are arranged in a spatial (e.g., grid) layout over a surface area of the package. While BGA technology is popular for high connection density, high heat conduction, and short, low-inductance connections, one issue limiting this surface mount technology is the stand-off height. For a given z-height allotted to the packages (currently on the order of 0.5 mm to 2 mm), the typical BGA stand-off may be nearly 300 µm, using up valuable physical volume that could be occupied by functional devices.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are BGA packages including an LGA package extension, as well as techniques to form such extended packages. In some embodiments, a subset of lands on a substrate are populated with solder balls, while only solder paste is dispensed on other lands. Lands with low-volume solder features may occupy an interior space surrounded by the high-volume solder features residing within a perimeter area. Resulting differences in solder stand-off height may accommodate non-planarity in a package and/or the insertion of an LGA extension component, such as or one or more ICs and/or discrete devices. An LGA extension component may be attached to the low-volume solder features, for example by reflowing the solder paste. Solder paste may then be dispensed on lands located on the extension component. A BGA package may then be attached to the high-volume solder features and further coupled to the extension lands, for example by reflowing the solder balls and solder paste. The larger-volume BGA solder connections may maintain mechanical reliability of the package, particularly where the solder balls are located along a perimeter of a package assembly, surrounding the low-volume solder interconnects.

Figure 1A:
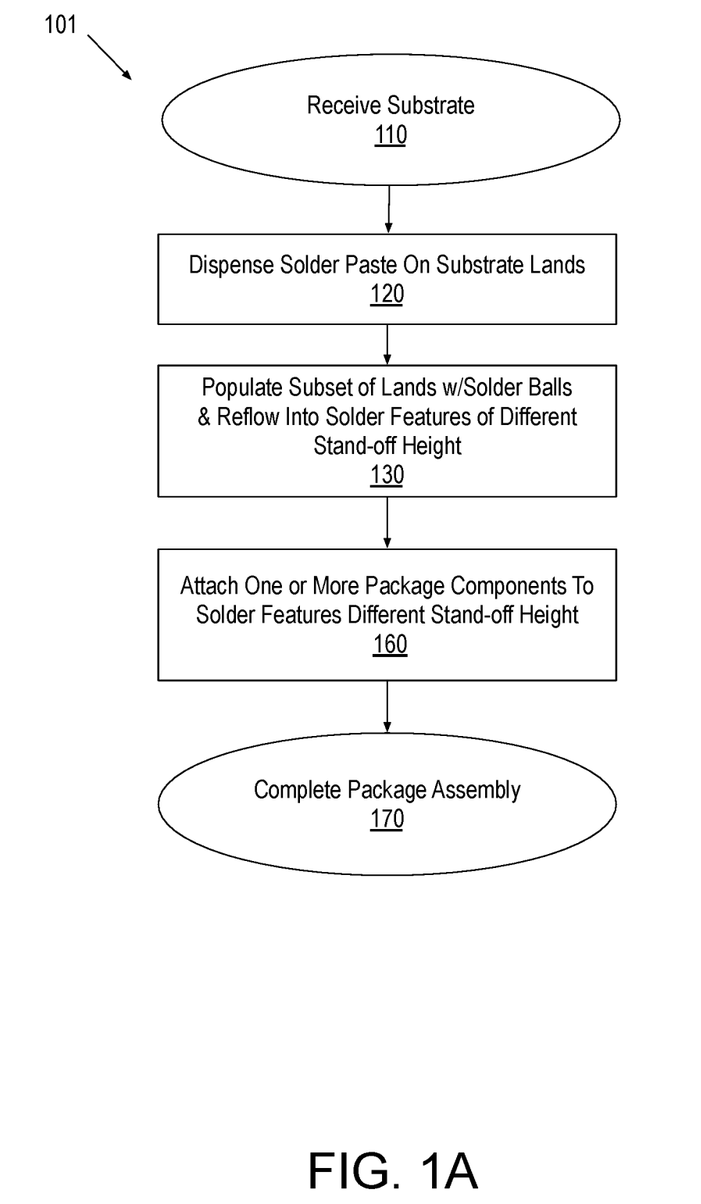
FIG. 1A is a flow diagram illustrated methods of fabricating an LGA package extension, in accordance with some embodiments.

FIG. 1A is a flow diagram illustrating methods 101 for fabricating an LGA package extension, in accordance with some embodiments. Methods 101 combine solder ball interconnects with lower-volume solder features associated with LGA interconnects within a given package assembly footprint. In some exemplary embodiments, the stand-off height difference between LGA and BGA interconnects accommodates recesses in either the assembly substrate or component(s) package attached to an assembly substrate. In other exemplary embodiments, the stand-off height difference between LGA and BGA interconnects accommodates the insertion of a component under another component within the package assembly footprint. Therefore, methods 101 may be employed to attach one or more components to a package assembly substrate with a difference in stand-off height between first solder features (e.g., resulting from the reflowing of solder paste) and second solder features (e.g., resulting from the reflowing of solder balls).

Methods 101 begin with receiving a package assembly substrate at operation 101. The package assembly substrate may be any PCB, interposer, or the like. In some exemplary embodiments, the PCB in a multi-level board including a plurality of conductive trace levels laminated with glass-reinforced epoxy sheets (e.g., FR-4). The package assembly substrate further includes lands coupled to one or more conductive trace levels. The lands may include a surface finish, such as NiPdAu or Copper Organic Solderability Preservative (Cu OSP), which is solder-wettable. A top surface of the package assembly substrate may be otherwise covered in a solder resist having openings exposing the lands. The solder resist may be any material that is non-wettable by solder. In some embodiments, the solder resist comprises a polymer (e.g., an epoxy resin, such as, but not limited to an acrylate of novolac). In some embodiments, the lands are spatially arrayed over an area or footprint of the substrate associated with a package assembly. The spatial array may be a grid array, for example, and have minimum grid pitch that can vary with implementation. In some embodiments, the land grid pitch is around 600 µm, or less. Dimensions of the lands may vary over the array, or be substantially equal over the array. In some grid array embodiments, the individual lands have a lateral width that is a function of the grid pitch (e.g., around 60% of the grid pitch).

Methods 100 continue at operation 120 where solder paste is applied to at least a subset of the substrate lands within the package assembly footprint. In some embodiments, solder paste is applied to all substrate lands within the package assembly footprint. In other embodiments, solder paste is selectively applied only to a first subset of the substrate lands within the package assembly footprint. Any solder paste composition and solder paste application process may be employed at operation 120. The solder paste applied at operation 120 may include a metallic filler in a matrix, for example. The metallic filler may be a Sn—Ag—Cu (SAC) alloy, such as, but not limited to SAC 305 or SAC 405. The matrix may be any known in the art and will typically include a small percentage of volatile organic compounds (VOCs). In some illustrative embodiments, solder paste is applied with a stencil printing operation.

Methods 101 continue at operation 130 where solder balls are dispensed onto a subset of the lands within the package assembly footprint. Unlike solder paste, solder balls are typically purely metallic, lacking any significant VOC content. In some exemplary embodiments, the solder balls dispensed at operation 130 are a SAC alloy, such as, but not limited to SAC 305 or SAC 405. Solder balls dispensed at operation 130 may have any diameter, for example in the range of 300-800 µm. In some embodiments, solder balls are dispensed selectively, for example with a pick- and place technology, to a predetermined subset of substrate lands. In some alternative embodiments, solder balls are dispensed non-selectively, for example with a squeegee, and a portion of the balls not retained by solder paste is subsequently removed (e.g., by vacuum or gravity). A solder reflow may be performed, which converts the solder balls to large-volume solder features. At this point in methods 101, large-volume solder features are permanently attached to a subset of the substrate lands. If solder paste was applied to all substrate lands at operation 120, then the substrate lands lacking large-volume solder features will also have small-volume solder features resulting from reflow of the solder paste. If solder paste was applied at operation 120 to the same subset of lands that received a solder ball at operation 130 (e.g., as a means of defining the subset of lands that are to receive a solder ball), then a second application of solder paste may be subsequently made to those lands which lack a solder ball.

Methods 100 continue at operation 160 where one or more package components are attached to the lands within the package assembly footprint. Operation 160 may, for example, entail a reflow of the solder features in each of the lands within the package assembly footprint, thereby coupling the package assembly components to the substrate. Differences in solder volume between the lands result in differences in stand-off height for various components and/or regions. The difference in stand-off height may, in some embodiments, accommodate a recess in a component. For example where one area of a package is recessed relative to another area, the non-planarity of the package can be matched to the stand-off height variation across the substrate lands. As another example, a first of the components may be attached to solder features of a first stand-off height, and a second of the components may be attached to solder features of a second stand-off height. In some further embodiments, a first of the components attached to some solder features providing a low stand-off height (e.g., associated with a low volume solder features) is inserted between the substrate a second of the components that is attached to other solder features having a sufficiently tall stand-off height to accommodate the height of the first component.

Methods 101 then complete with output of the package assembly at operation 170. To complete the package assembly, any additional package assembly operations known in the art may be performed at operation 170. For example, an overmold of the package assembly may be performed.

Figure 1B:
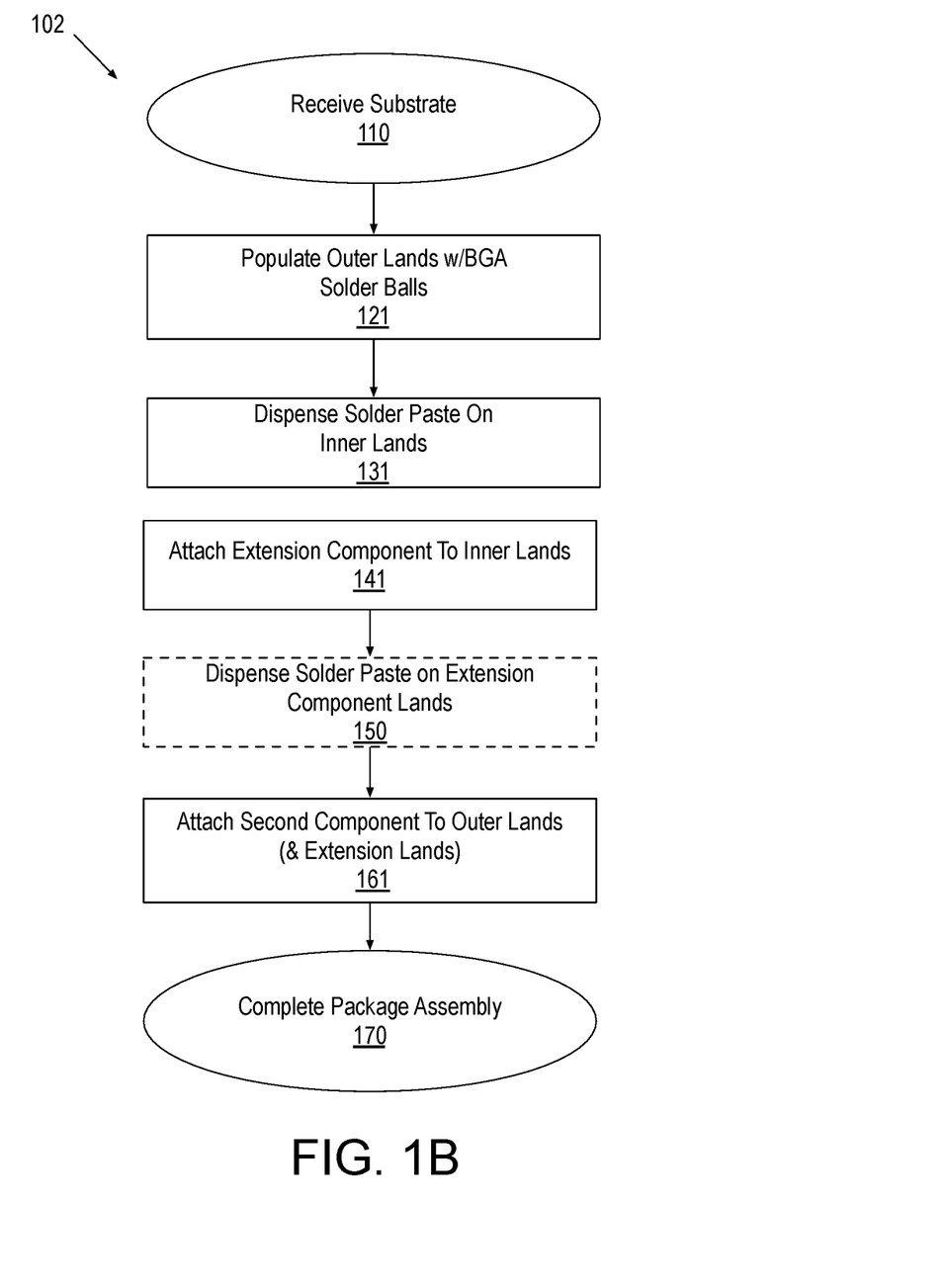
FIG. 1B is a flow diagram illustrated methods of fabricating an LGA package extension, in accordance with some embodiments.

FIG. 1B is a flow diagram illustrated methods 102 for fabricating an LGA package extension, in accordance with some embodiments. Methods 102 further illustrate some exemplary embodiments of methods 101. FIG. 2-5 illustrate top-down plan views of a package assembly evolving as methods 102 are practiced, in accordance with some further embodiments. Referring first to FIG. 1B, methods 102 begin with operation 110 where the substrate is received or fabricated, for example as described above in the context of methods 101. At operation 121, solder balls are dispensed onto a first subset of the substrate lands. In some exemplary embodiments, the first subset of lands occupy an outer perimeter area of the package assembly footprint. Once the desired subset of lands is populated, any known solder reflow process may be employed, or the solder balls simply held in place by flux and/or solder paste.

Figure 2:
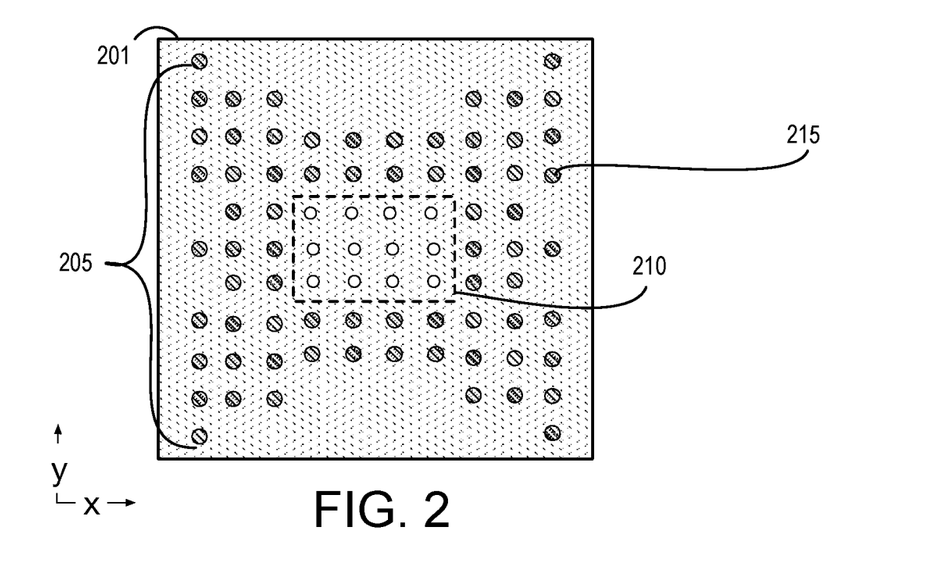
FIG. 2 is a top-down plan view of a substrate with first lands populated with solder balls, in accordance with some embodiments.
Figure 3:
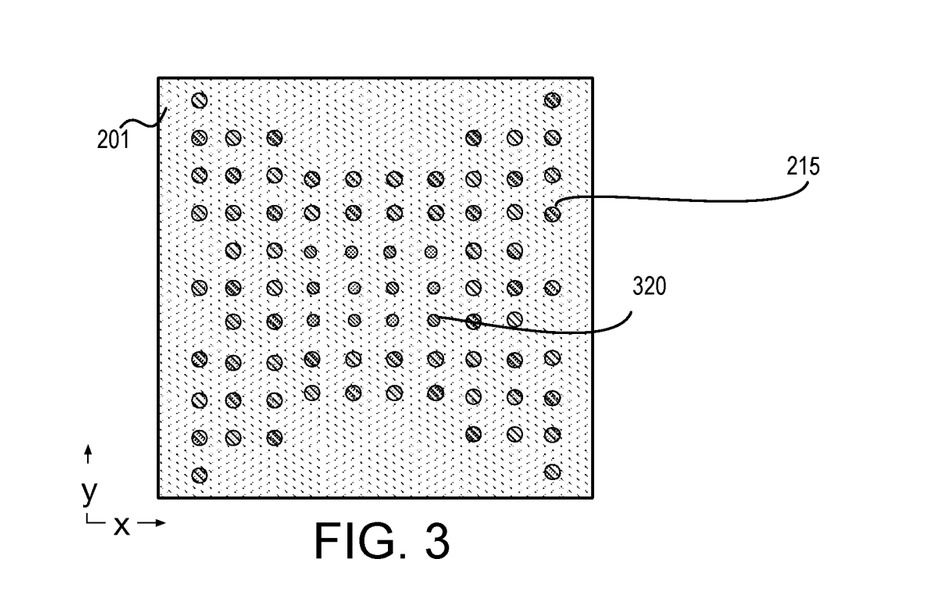
FIG. 3 is a top-down plan view of a solder paste dispensed on second lands of a substrate, in accordance with some embodiments.

In the example further illustrated in FIG. 2, a PCB 201 received as the substrate includes a plurality of metallized lands 205 arrayed over a package assembly footprint. Lands 205 all have the same diameter and may have a grid pitch to accommodate a given BGA pitch, such as, but not limited: approximately 600 μm (e.g., 635 μm); approximately 500 μm; approximately 400 μm (e.g., 406 μm); approximately 300 μm (e.g., 305 μm); or approximately 150 μm. In the illustrated example, lands 205 include an inner land subset surrounded by an outer land subset, where dashed line 210 demarks the boundary between inner and outer lands. As further shown, the outer lands have received solder balls 215 while the inner lands have not, indicative of a selective ball dispense. In some embodiments, solder balls 215 may be held in place with solder paste (not depicted). At this point in the assembly process, solder paste may also be present on the inner lands, or not.

Returning to FIG. 1B, methods 102 continue at operation 131 where solder paste is applied to at least a first subset of lands, if it has not already been applied (e.g., as part of operation 121). The solder paste applied at operation 131 may be any, for example including a SAC alloy and a matrix having some percentage of VOCs. In the example illustrated in FIG. 3, solder paste 320 has been applied to the inner land subset. Following paste application, any suitable solder reflow process may be performed, if desired. At this point, substrate 201 includes a hybrid BGA-LGA layout regardless of whether solder paste application was applied once (e.g., with operation 131 performed before or after operation 121), or applied multiple times (e.g., both at operation 121 and 131).

Returning to FIG. 1B methods 102 continue at operation 141 where a first component is attached to the inner lands. Attachment may be by any technique known in the art to be suitable for attaching a given component to a substrate with a LGA. The first component may be referred to herein as an "LGA extension component," or simply "extension component" because this component is attached not by BGA, but rather by LGA, relying on solder features resulting from solder paste application. The extension component may be contained within a package, or not. In some examples, the extension component comprises an IC chip, such as, but not limited to a memory IC (e.g., eDRAM), a logic IC, a power IC, or a system-on-chip (SOC). As first side of the IC chip may be attached, for example with any flip-chip technique. In some further embodiments, the IC includes routing metallization on both sides of the IC chip. Devices in the IC chip may be coupled to routing metallization on a second side of the IC by through vias, for example. Alternatively, the extension component comprises a discrete device, such as, but not limited to a capacitor, inductor, or resistor. An extension component may be, for example, discrete decoupling capacitors. Discrete devices may be contained in any package suitable for attaching to a substrate LGA. Once attached, methods 102 may continue with operation 150 where additional solder paste is dispensed onto lands of the extension component, or instead continue with operation 160 where a second component is attached to the vacant outer lands. Operation 150, denoted in dashed line, is optional and may be performed for embodiments where the extension component includes lands on its second side, opposite substrate 201. For the example illustrated in FIG. 4, extension component 425 is attached to the inner LGA area of substrate 201. Extension component 425 further includes lands 430 on a second side of the component to which solder paste is applied in preparation for subsequent attachment of another component. Lands 430 may all have the same diameters, and may have a grid pitch to accommodate a given pitch, such as any of the examples listed for lands 205. In some exemplary embodiments lands 230 and lands 205 have the same lateral dimension and pitch, such that lands 230 serve to backfill, supplement, or replace the inner subset of lands 205 occupied by extension component 425. The solder paste applied to lands 230 may be any known in the art, for example including a SAC alloy and some percentage of VOCs. Following paste application, any suitable solder reflow process may be performed, if desired. For alternate embodiments where the extension component lacks a second side with lands, a die-attach paste (DAP), die-attach film (DAF), or the like may be applied to extension component 425, if desired.

Returning to FIG. 1B, methods 102 continue at operation 161 where a second component is attached to at least the outer lands. For embodiments where solder paste was applied to lands on a back side of the extension component, the second component may be electrically interconnected directly to both the substrate and to the extension component. The component attached at operation 161 may be contained within a package, or not. In some examples, the component attached at operation 161 comprises an IC chip, such as, but not limited to, a memory IC, a logic IC, a power IC, or a system-on-chip (SOC). A logic IC in this context may be a microprocessor, for example. In some embodiments, the component attached at operation 161 includes multiple IC chips, which may have been pre-assembled onto a package substrate. The package substrate may be any substrate known to be suitable for one or more of flip-chip packages (FCBGA), package-on-package (PoP), system-in-package (SiP), or the like. In some embodiments, the package substrate comprises a laminate of electrical routing metallization embedded within dielectric build-up layers.

Figure 5:
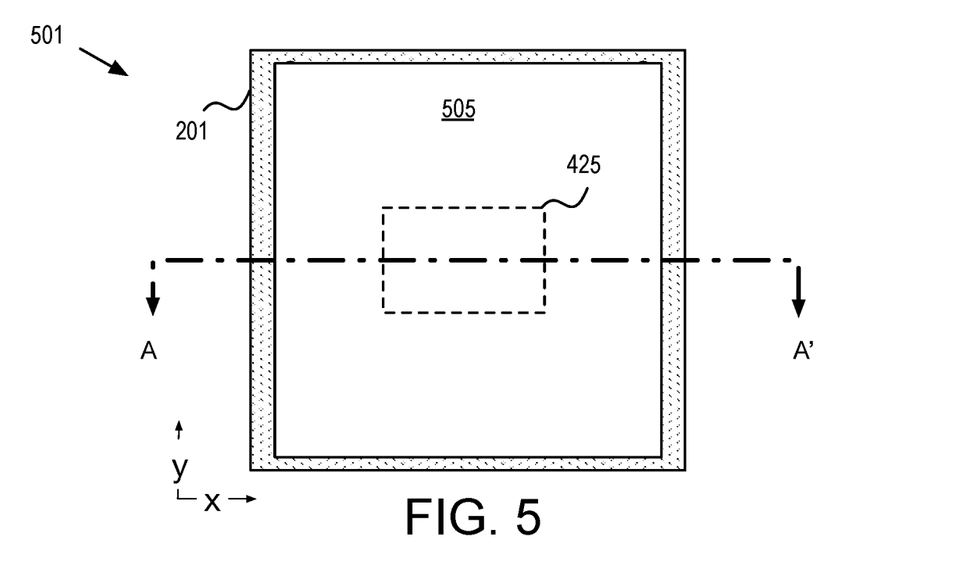
FIG. 5 is a top-down plan view of a substrate with a BGA package attached to the first lands of a substrate, in accordance with embodiments

For the example illustrated in FIG. 5, package assembly 501 includes a component 505 that is attached to the outer BGA area of substrate 201 and also attached to the inner LGA area provided by extension component 425. Component 505 covers extension component 425.

Figure 4:
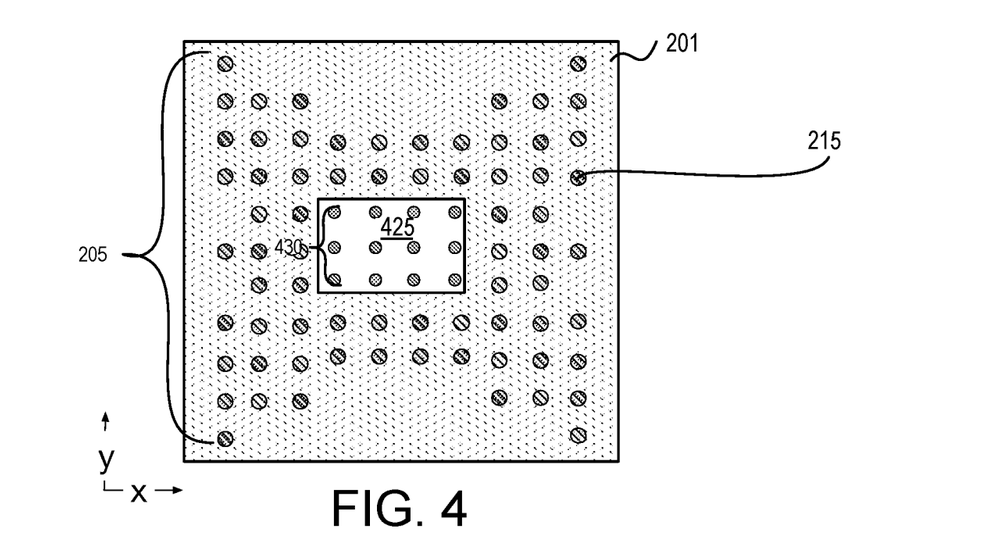
FIG. 4 is a top-down plan view of a substrate with an LGA extension component attached to the second lands of a substrate, in accordance with embodiments.
Figure 6A:
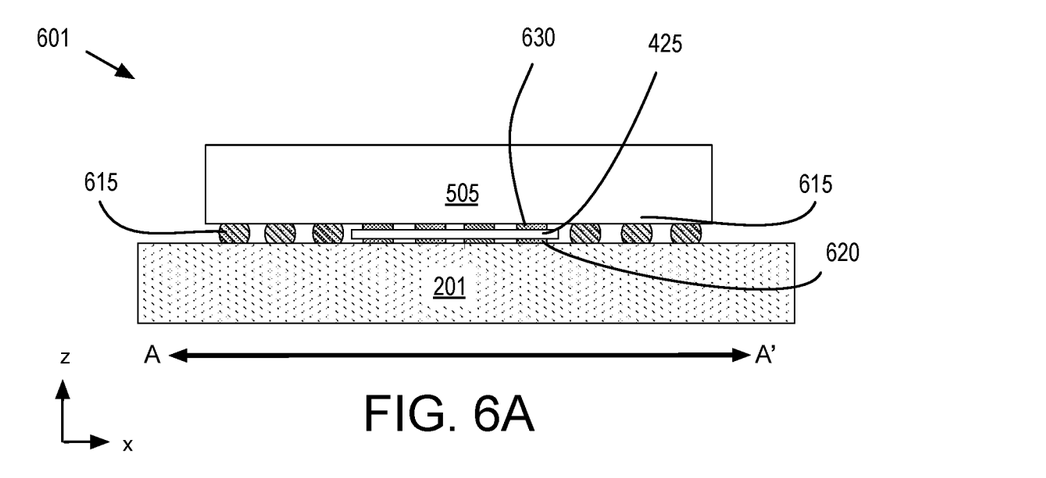
FIG. 6A depicts a cross-sectional view of a BGA package including an LGA package extension, in accordance with some embodiments.

FIG. 6A depicts a cross-sectional view of an LGA-extended BGA package assembly 601 including solder features of varying height, in accordance with some embodiments of assembly 501. The sectional view shown in FIG. 6A is along the dashed A-A' line denoted in FIG. 5. As shown in FIG. 6A, extension component 425 is attached to substrate 201 through solder features 620, for example resulting from the reflow of solder paste 320. These features have a low stand-off height associated with their small solder volume. Extension component 425 is further attached to component 505 through solder features 630, for example resulting from the reflow of solder paste applied to lands 430 (FIG. 4). These features also have a low stand-off height associated with their small solder volume. Component 505 is attached to substrate 201 through solder features 615, for example resulting from the reflow of solder balls 215. These features have a high stand-off height associated with their large solder volume. In some embodiments, solder features 615 have a stand-off height (e.g., in the z-dimension) that is greater than the stand-off height of solder features 620 summed with solder features 630. For example, solder features 615 may have a stand-off height of 200-300 μm, or more, while solder features 620 and 630 each have a stand-off height no more than 100 μm. Extension component 425 can then have a z-dimension thickness of up to 100 μm such that the total z-height of solder features 620 and 630 summed with the z-thickness of extension component 425 is equal to the stand-off height of solder features 615. Larger solder balls may be employed to further increase the stand-off height of solder features 615 for accommodating a thicker extension component, as needed.

Solder features 620 may be expected to have some height variation across their population. However manufacturing tolerances are such that solder ball diameter variation can be controlled to well below 10% and indeed pick-and-place operations typically cannot accommodate solder ball variation greater than 10% without incurring significant process marginality and a concomitant yield reduction. Variations in solder feature stand-off height between solder features 615 and solder features 620, for example, is much greater than 10% are therefore indicative of a BGA technique being extended with an LGA technique in accordance with embodiments herein. Notably, solder features 615 have a greater solder volume attributable to the solder ball and can be expected to be more resilient than the low volume solder features 620 and/or 630. However, with solder features 615 disposed nearest the perimeter edge of package assembly 601, assembly 601 may be able to absorb deformation energy without failures that a LGA might otherwise suffer.

In some further embodiments, solder features 620 and/or 630 have voids of at least 5% of their solder area. Such voids may be present at the interface of lands, or may be located in the bulk of solder features 620 and/or 630. In some embodiments, solder features 620 and/or 630 have voids of at least 5% of solder area within the solder bulk, and the void area may be even higher at the interface with the substrate lands. In some embodiments, solder features 620 and/or 630 have voids of at least 15% of solder area. The existence of voids, particularly within the solder feature bulk, is indicative of these features resulting from a solder paste process. Voids are generally attributable to VOCs within a solder paste, and form as the paste is reflowed into solder features 620 and or 630. Voiding area is generally a well-characterized quality control parameter monitored in paste-based processes. In some further embodiments, voiding is substantially absent within solder features 615. Voiding is not indicative of a solder ball process because solder balls are typically purely metallic, lacking any significant VOC content. Hence, a voiding area over 5%, and certainly over 15% within first solder features coupled to extension component 425 and a much lower voiding area in second solder features coupling component 505 to substrate 201 is indicative of an LGA-extended BGA process in accordance with some embodiments herein.

Figure 6B:
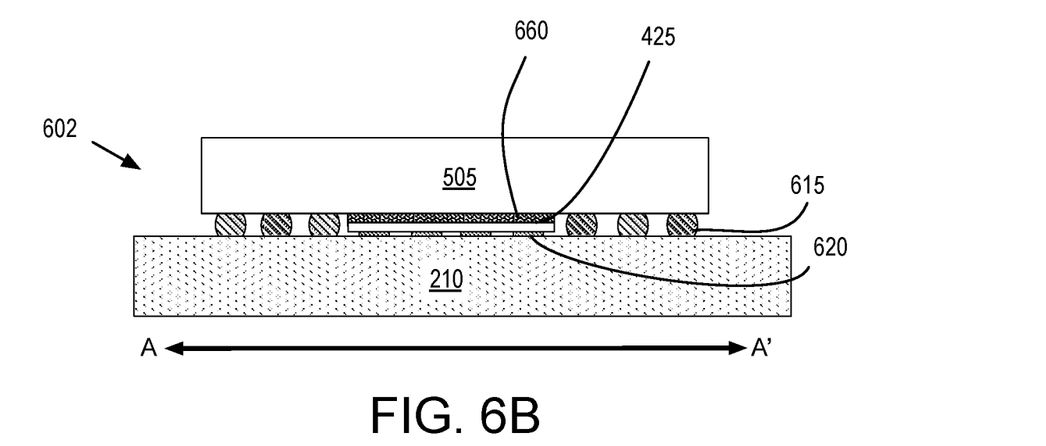
FIG. 6B depicts a cross-sectional view of a BGA package including an LGA package extension, in accordance with some embodiments.

FIG. 6B depicts a cross-sectional view of an LGA-extended BGA package assembly 602 including solder features of varying height, in accordance with some embodiments of assembly 501. The sectional view shown in FIG. 6B is along the dashed A-A' line denoted in FIG. 5. As shown in FIG. 6B, extension component 425 is attached to substrate 201 through solder features 620, for example resulting from the reflow of solder paste 320. These features have a low stand-off height associated with their small solder volume. Extension component 425 is further attached to component 505 by DAP or DAF 660. DAP/DAF 660 does not provide any of the electrical interconnects provided by solder features 630 found in package assembly 601. Package assembly 602 may therefore be generated by excluding operation 150 from methods 102 (FIG. 1B) and instead applying the DAP/DAF 660 to the extension component. DAP/DAF 660 also has a low stand-off height. Component 505 is again attached to substrate 201 through solder features 615, for example resulting from the reflow of solder balls 215. These features have a high stand-off height associated with their large solder volume. In some embodiments, solder features 620 have a stand-off height (e.g., in the z-dimension) that is greater than the stand-off height of solder features 620 summed with the z-thickness of DAP/DAF 660. For example, solder features 615 may have a stand-off height of 200-300 μm, or more, while solder features 620 and DAP/DAF 660 each have a stand-off height no more than 100 μm. Extension component 425 can then have a z-dimension thickness of up to 100 μm such that the total z-height of solder features 620 summed with the z-height of DAP/DAF 660 and extension component 425 is equal to the stand-off height of solder features 615. Notably, larger solder balls may be employed to further increase the stand-off height of solder features 615 for accommodating a thicker extension component, as needed.

Figure 6C:
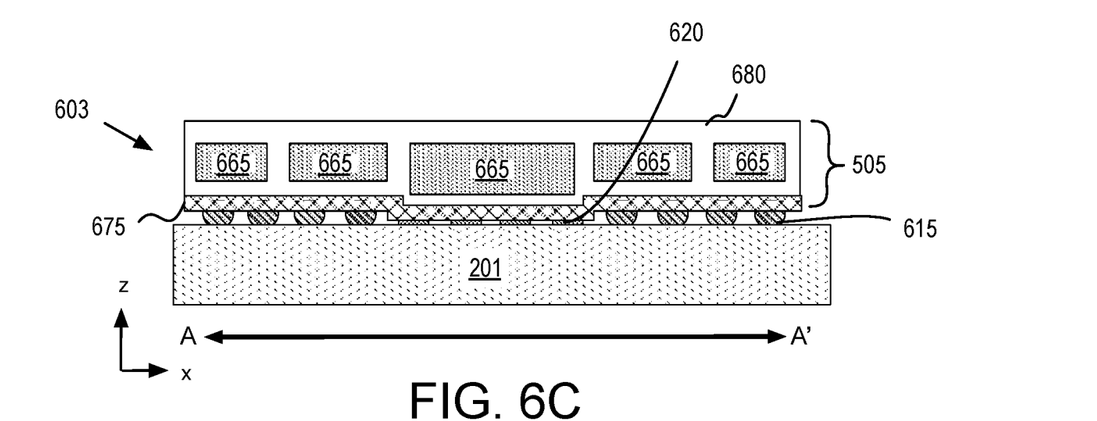
FIG. 6C depicts a cross-sectional view of a BGA package including an LGA package extension, in accordance with some embodiments.
Figure 6D:
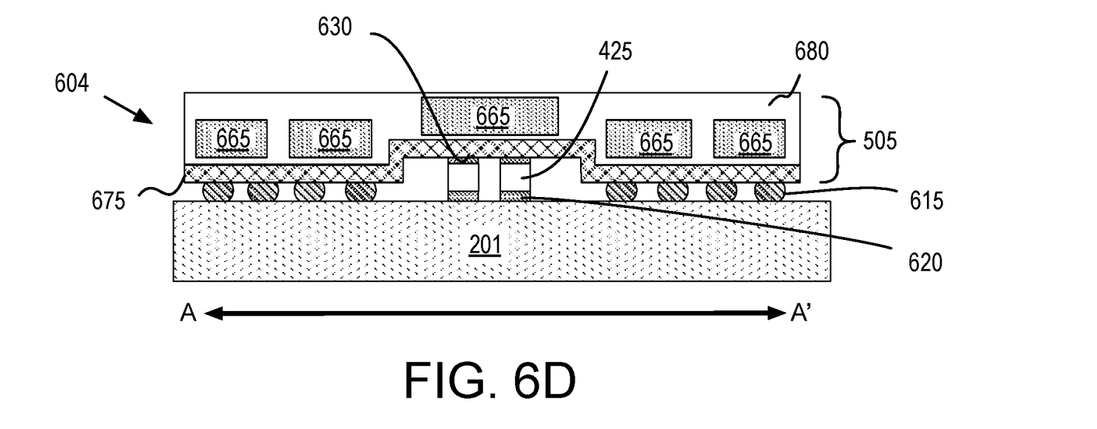
FIG. 6D depicts a cross-sectional view of a BGA package including an LGA package extension, in accordance with some embodiments.
Figure 6E:
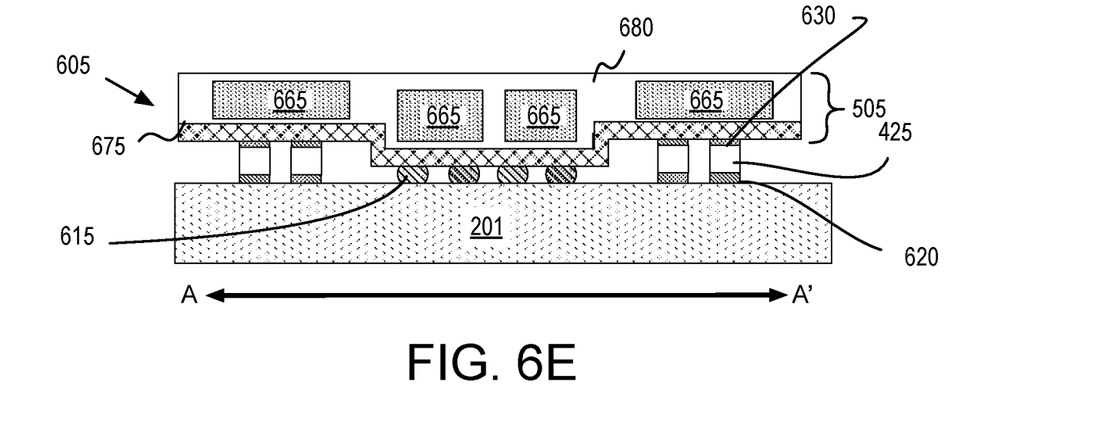
FIG. 6E depicts a cross-sectional view of a BGA package including an LGA package extension, in accordance with some embodiments.

FIG. 6C-6E further illustrate cross-sectional views of LGA-extend BGA package assemblies which leverage solder features of varying height to at least partially accommodate recesses or non-planarity in a package that is attached to the assembly substrate. FIG. 6C depicts a cross-sectional view of an LGA-extended BGA package assembly 603 including solder features of varying stand-off height, in accordance with some embodiments. Assembly 603 may be fabricated according to methods 101, for example. The sectional view shown in FIG. 6C is along the dashed A-A' line denoted in FIG. 5.

As shown in FIG. 6C, component 505 is a package including a plurality of ICs and/or discrete devices 665 embedded in a package overmold material (e.g., an epoxy resin) 680. Component 505 includes a non-planar package substrate 675 having an area near the package substrate edge that is recessed relative to a center area. Such package non-planarity may be incorporated into a PoP, SiP, or the like, to accommodate IC and/or discrete devices of different thickness (e.g., z-dimensional height). Hence, instead of inserting an additional component within a gap afforded by varying solder feature volume, a component of varying thickness is accommodated through selective solder feature volume control. In the example shown in FIG. 6C, component 505 includes ICs 665 of different thickness. ICs 665 may be interconnected to each other and/or to package substrate 675 by solder features, wire bonds, lead frames, or any other packaging interconnect architecture. The thickest portion of component 505 is positioned over low-volume solder features 620. The lower stand-off height of solder features 620 accommodates the thickest portion of component 505 while portions of component 505 having a nominal thickness are positioned over the large-volume solder features 615. As such, the difference in stand-off heights may be co-located with thick component regions as needed to reduce the total package assembly z-height relative to an assembly that relies exclusively on BGA interconnects to substrate 201.

Notably, package assemblies including LGA extension components may also include non-planar component packages. In some such embodiments, differences in solder feature stand-off height may work in synergy with a non-planar component to accommodate an intervening component thickness that is greater than a difference in solder stand-off height. FIG. 6D depicts a cross-sectional view of an LGA-extended BGA package assembly 604 including solder features of varying stand-off height, in accordance with some embodiments. Assembly 604 may be fabricated according to methods 101, for example. The sectional view shown in FIG. 6D is along the dashed A-A' line denoted in FIG. 5.

As shown in FIG. 6D, component 505 includes non-planar package substrate 675. In this embodiment, a center portion of substrate 675 is recessed from a perimeter or edge portion of substrate 675. Extension component 425 is co-located with the recess of package substrate 675. Extension component 425 may be, for example, a discrete decoupling capacitor. Extension component 425 (e.g. a first capacitor terminal) is electrically interconnected to substrate 201 by solder feature 620. Extension component 425 (e.g., a second capacitor terminal) is also electrically interconnected to component 505 by solder feature 630. Component 505 is electrically interconnected to substrate 201 by solder features 615. The z-height of extension component 425 is not entirely accommodated by the difference in stand-off height between solder features 615 and 620, 630 with the remainder accommodated by the non-planarity in package substrate 675. Hence the stand-off associated with BGA solder features is better utilized by introducing LGA solder features in a limited region of assembly 604. As shown in FIG. 6D, if solder features 615 were low-volume features similar to solder features 620, the total z-height of package assembly 604 would be increased by the difference in stand-off height between low-volume solder features 620 and high-volume features 615.

Although an assembly with large volume solder features at the perimeter may absorb deformation well, providing a robust package, low-volume solder features may also be employed at an edge of an assembly. FIG. 6E depicts a cross-sectional view of an LGA-extended BGA package assembly 605 including solder features of varying stand-off height, in accordance with some embodiments. Assembly 605 may be fabricated according to methods 101, for example. The sectional view shown in FIG. 6E is along the dashed A-A' line denoted in FIG. 5. As shown in FIG. 6E, component 505 includes non-planar package substrate 675. In this embodiment, a center portion of substrate 675 is proud of a perimeter or edge portion of substrate 675. Extension component 425 is located at the edge recesses of package substrate 675. Solder feature 620 electrically interconnects extension component 425 to substrate 201, and solder features 630 electrically interconnect extension component 425 to component 505. The location of extension component 425 and where low-volume solder features are placed may therefore be a function of how much of the assembly footprint is to be occupied by extension component 425, and/or whether the assembly includes an individual extension component 425 (which is well-suited to being centered within the assembly), or includes many extension components 425 (which may be well-suited to distribution along a perimeter of the package assembly).

Figure 7:
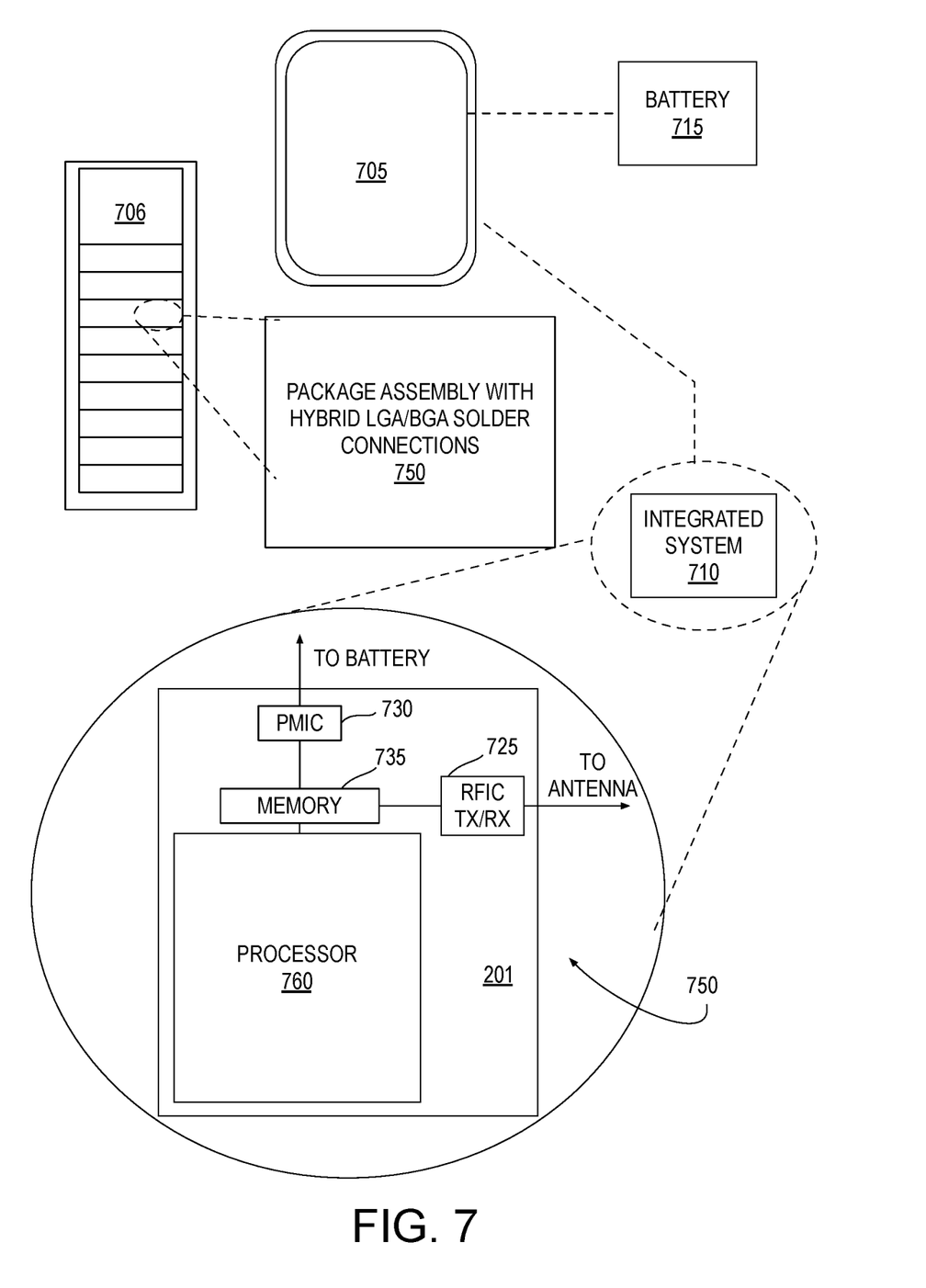
FIG. 7 illustrates a mobile computing platform and a data server machine employing a BGA packaged microprocessor and/or memory including an LGA package extension, in accordance with embodiments.

FIG. 7 illustrates a mobile computing platform and a data server machine employing a package assembly including BGA-LGA hybrid solder connections, for example as described elsewhere herein. The server machine 706 may be any commercial server, for example including any number of high-performance computing platforms disposed within a rack and networked together for electronic data processing, which in the exemplary embodiment includes a packaged monolithic SoC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

As a system component within the server machine 706, package assembly 750 may include a memory block (e.g., RAM) and a processor block (e.g., a microprocessor, a multi-core microprocessor, graphics processor, or the like) interconnected through both BGA solder connections and LGA solder connections to a substrate. As a packaged integrated system 710, package assembly 750 includes BGA solder connections extended with LGA solder connections, for example as described elsewhere herein. Assembly 750 includes substrate 201 to which one or more of a power management integrated circuit (PMIC) 730, RF (wireless) integrated circuit (RFIC) 725 including a wideband RF (wireless) transmitter and/or receiver (TX/RX), and memory 735 are interconnected to substrate 201 through BGA solder connections and LGA solder connections.

Functionally, PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs or integrated into monolithic SoC 750.

Figure 8:
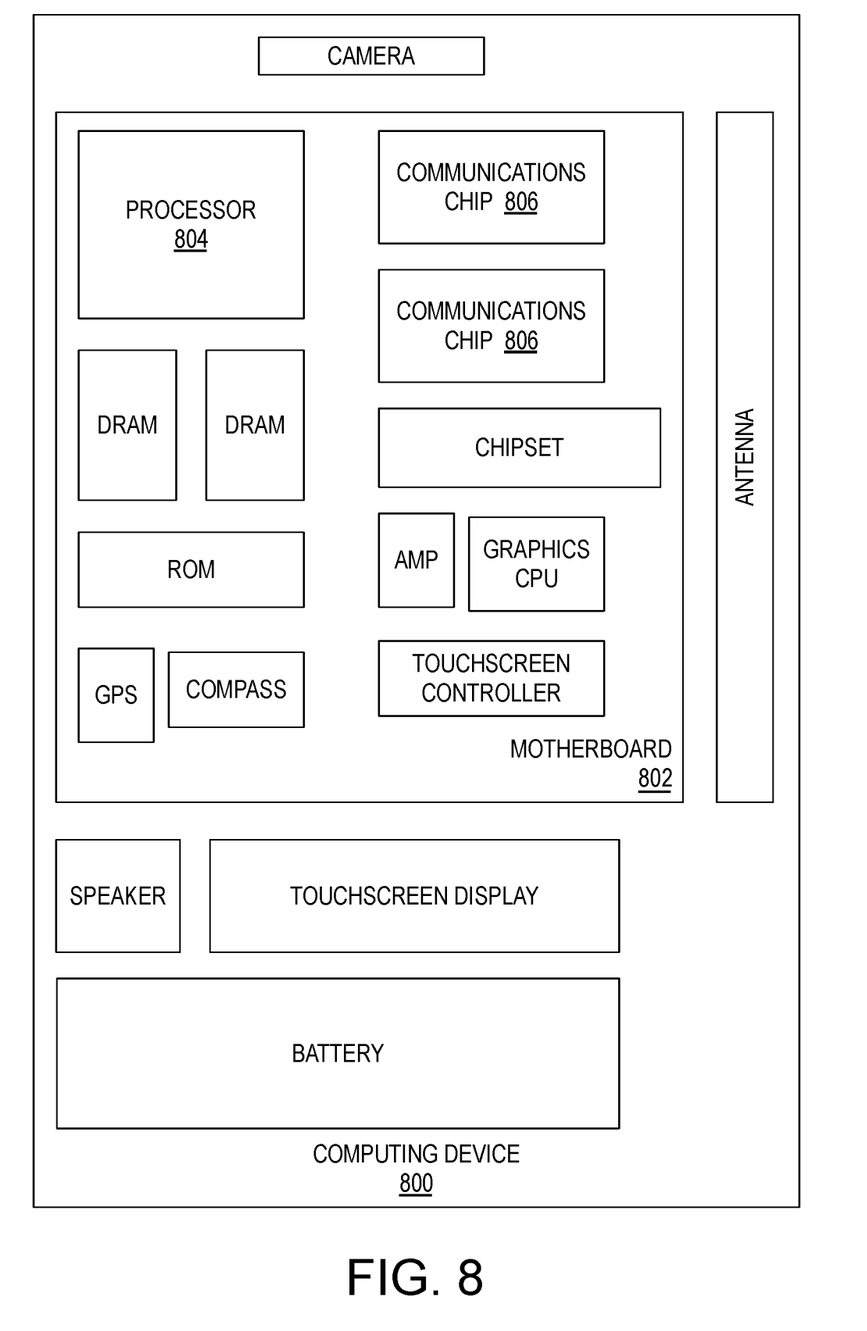
FIG. 8 is a functional block diagram of an electronic computing device, in accordance with some embodiments.

FIG. 8 is a functional block diagram of an electronic computing device, in accordance with some embodiments. Computing device 800 may be found inside platform 705 or server machine 706, for example. Device 800 further includes a motherboard 802 hosting a number of components, such as, but not limited to, a processor 804 (e.g., an applications processor), which may be in a package coupled to motherboard 802 by BGA connections extended with LGA connections, for example as described elsewhere herein. Processor 804 may be physically and/or electrically coupled to motherboard 802. In some examples, processor 804 includes an integrated circuit die packaged within the processor 804 and connections between the IC die and the processor 804 are further by BGA and LGA solder connections of differing stand-off heights, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like. Any of these other components may also be coupled to motherboard 802 by BGA solder connections of differing heights, for example as described elsewhere herein.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first examples, a microelectronic device package assembly comprises a substrate including first lands and second lands. One or more components are attached to the first lands by first solder features, and attached to the second lands by second solder features. The first solder features have a different stand-off height than the second solder features. The difference in stand-off height between the first and second features accommodates a recess in a package of the components, or accommodates insertion of a first of the components between the substrate a second of the components.

In one or more second examples, for any of the first examples, the second lands form a perimeter surrounding the first lands.

In one or more third examples, for any of the first or second examples, the first solder features have a smaller stand-off height than the second solder features. A first of the components has a first side attached to the first lands. A second of the components is stacked over the first of the components, and has a first side attached to the second lands.

In one or more fourth examples, for and of the first, second, or third examples a thickness of the first component summed with a stand-off height of the first solder features is less than a stand-off height of the second solder features.

In one or more fifth examples, for and of the first, second, third or fourth examples the second of the components is electrically coupled to the first of the components by third solder features, wherein the third solder features have a smaller stand-off height than the second solder features. The thickness of the first of the components summed with the stand-off height of the first solder features and a stand-off height of the third solder features is equal to the stand-off height of the second solder features.

In one or more sixth examples, for any of the first, second, third, fourth, or fifth examples the stand-off height of the second solder features is at least 200 µm, and the stand-off height of the first and second solder features is no more than 100 µm.

In one or more seventh examples, for any of the first, second, third, fourth, fifth, or sixth examples the first of the components comprises one or more capacitors having a first electrode electrically coupled to the substrate through one or more of the first solder features, and a second electrode electrically coupled to the second component through one or more of the third solder features.

In one or more eighth examples, for any of the first, second, third, fourth, fifth, sixth, or seventh examples a first of the components comprises an IC chip or a discrete device.

In one or more ninth examples, for any of the first, second, third, fourth, fifth, sixth, seventh, or eighth examples the substrate comprises a printed circuit board (PCB), and a second of the components comprises one or more packaged IC chips.

In one or more tenth examples, the assembly for any of the first, second, third, fourth, fifth, sixth, seventh, eighth or ninth examples further comprises a die-attach film (DAF) or die-attach paste (DAP) between the first and second components.

In one or more eleventh examples, for any of the first, second, third, fourth, fifth, sixth, seventh, eighth, ninth, or tenth examples the substrate comprises a printed circuit board (PCB). The one or more components comprise a package substrate having a chip side to which one or more IC chips are attached, and a land-side opposite the chip side that is electrically coupled to the first component and to the substrate. The land-side of the package substrate has a first area that is recessed from a second area. The first solder features have a smaller stand-off height than the second solder features. The first package substrate area is electrically coupled to the PCB by the second solder features. The second package substrate area is electrically coupled to the PCB by the first solder features.

In one or more twelfth examples, a microelectronic device, comprises a microprocessor, a memory, and a battery. At least the microprocessor is coupled to a substrate including first lands and second lands. A first component has a first side attached to the first lands by first solder features having a first stand-off height. The microprocessor is stacked over the first component, and has a first side attached to the second lands by second solder features having a second stand-off height that is at least equal to the first stand-off height summed with a thickness of the first component.

In one or more thirteenth examples, for any of the twelfth examples the memory comprises and eDRAM; and the first component is an eDRAM chip.

In one or more fourteenth examples, for any of the twelfth or thirteenth examples the first component has a second side attached to the microprocessor by third solder features having the first stand-off height.

In one or more fifteenth examples, a method of fabricating a microelectronic package assembly, the method comprises applying solder paste to at least first lands of an assembly substrate. The method comprises dispensing solder balls on second lands of the substrate. The method comprises attaching one or more components to the substrate with a difference in stand-off height between first solder features, resulting from reflowing the solder paste, and second solder features, resulting from reflowing the solder balls, accommodating a recess in a package of the components, or accommodating insertion of a first of the components between the substrate and a second of the components.

In one or more sixteenth examples, for any of the fifteenth examples attaching the one or more components to the substrate further comprises attaching a first of the components to the first lands by reflowing the solder paste, and attaching a second of the components to the second lands by reflowing the solder balls, the second of the components covering the first of the components with the second solder features having a stand-off height at least equal to a thickness of the first of the components summed with a stand-off height of the first solder features.

In one or more seventeenth examples, for any of the fifteenth or sixteen examples the method further includes applying solder paste to third lands located on the first of the components, and attaching the second of the components to the third lands by reflowing the solder paste concurrently with the solder balls.

In one or more eighteenth examples, for any of the fifteenth, sixteenth, or seventeenth examples attaching the first of the components further comprises attaching a first electrode of a capacitor to the first lands, and attaching the second of the components to the third lands further comprises attaching a second electrode of the capacitor to the second of the components.

In one or more nineteenth examples, for any of the fifteenth, sixteenth, seventeenth, or eighteenth examples the second lands form a perimeter surrounding the first lands.

In one or more twentieth examples, for any of the fifteenth, sixteenth, seventeenth, eighteenth, or nineteenth examples attaching one or more components to the substrate further comprises attaching a recessed face of the package to the second lands and a non-recessed face of the package to the first lands.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of fabricating a microelectronic package assembly, the method comprising:
   receiving a substrate;
   dispensing solder balls on only some lands of the substrate, the solder balls having a first solder volume; and
   attaching one or more components to a first region of the substrate by reflowing a solder paste of a second solder volume, smaller than the first volume, to a first stand-off height, and attaching the one or more components to a second region of the substrate by reflowing the solder balls to a second stand-off height, greater than the first stand-off height, wherein attaching the one or more components further comprises:
   attaching a first of the components to first lands within the first region by reflowing the solder paste;
   attaching a second of the components to second lands within the second region by reflowing the solder balls, the second of the components covering the first of the components, and wherein the second stand-off height is at least equal to a thickness of the first of the components summed with the first stand-off height; and
   attaching the second of the components to the lands on a second side of the first of the components by reflowing solder paste between the first and second components.

2. The method of claim 1, wherein the first stand-off height is no more than 100 μm, and wherein the second stand-off height is at least 200 μm.

3. The method of claim 2, wherein a difference between the first and second stand-off heights accommodates a recess in a package of the components, and the recess located over the first region of the substrate.

4. The method of claim 3, wherein attaching the one or more components further comprises attaching a recessed face of the package to the second region by reflowing the solder balls, and attaching a non-recessed face of the package to the first region by reflowing the solder paste.

5. The method of claim 1, wherein attaching the one or more components further comprises attaching a first of the components to the first region of the substrate by reflowing the solder paste, and wherein attaching the one or more components further comprises attaching a second of the components to a portion of the substrate that surrounds the first component by reflowing the solder balls.

6. The method of claim 5, wherein the first of the components is inserted between a recessed face of a package of a second of the components, and attaching one or more of the components further comprises:
   attaching the first of the components to the substrate by reflowing the solder paste; and
   attaching a non-recessed face of the package to the first lands by reflowing the solder balls.

7. The method of claim 1, further comprising
   applying the solder paste to the lands located on the second side of the first of the components, and
   wherein attaching the second of the components to the lands on the second side comprises reflowing the solder paste between the first and second components concurrently with reflowing the solder balls.

8. The method of claim 7, wherein:
   attaching the first of the components further comprises attaching a first electrode of a capacitor to the first region of the substrate; and
   attaching the second of the components to the lands on the second side of the first of the components further comprises attaching a second electrode of the capacitor to the second of the components.

9. The method of claim 1, wherein the second region forms a perimeter surrounding the first region.

10. A method comprising:
    receiving a substrate;
    dispensing solder paste on lands of the substrate;
    populating only a subset of the lands with solder balls; and
    attaching one or more package components to the substrate by reflowing the solder paste and solder balls into solder features of different stand-off height, wherein attaching one or more package components further comprises attaching a first side of a first component to first lands, and wherein the method further comprises attaching a second component to the first component by reflowing a solder paste in contact with a second side of the first component.

11. The method of claim 10, wherein the subset of the lands is a perimeter surrounding the lands that are not populated with solder balls.

12. The method of claim 11, wherein the first component comprises a coupling capacitor.

13. The method of claim 10, wherein the second component comprises a package comprising one or more integrated circuit chips.

14. The method of claim 13, wherein the package comprises a non-planar package substrate, the package substrate comprises a recess to at least partially accommodate a z-height of the first component.

* * * * *